United States Patent [19]
VanNortwick et al.

[11] Patent Number: 6,012,502
[45] Date of Patent: Jan. 11, 2000

[54] APPARATUS FOR ATTACHING ADHESIVE TAPE TO LEAD-ON-CHIP LEADFRAMES

[75] Inventors: John VanNortwick, Boise, Id.; Scott Clifford, Santa Clara, Calif.

[73] Assignee: Micron Technology, Inc., Boise, Id.

[21] Appl. No.: 08/899,729

[22] Filed: Jul. 24, 1997

Related U.S. Application Data

[62] Division of application No. 08/509,048, Jul. 31, 1995.

[51] Int. Cl.[7] .............................. B32B 31/00; H01L 21/02
[52] U.S. Cl. ......................... 156/518; 156/511; 156/521; 156/530; 156/560; 156/499; 156/261; 156/263; 156/299
[58] Field of Search ...................................... 156/511, 515, 156/518, 521, 530, 562, 583.1, 499, 560, 261, 263, 299

[56] References Cited

U.S. PATENT DOCUMENTS

| | | | |
|---|---|---|---|
| 4,193,834 | 3/1980 | Bernardi | 156/521 |
| 4,279,682 | 7/1981 | Hamagami et al. | 156/367 |
| 4,862,245 | 8/1989 | Pashby et al. | 357/70 |
| 4,916,519 | 4/1990 | Ward | 257/666 |
| 4,985,105 | 1/1991 | Masuda | 156/261 |
| 4,994,411 | 2/1991 | Naito et al. | 437/209 |
| 5,278,101 | 1/1994 | Ikenoue | 437/217 |
| 5,285,105 | 2/1994 | Cain | 257/672 |
| 5,286,679 | 2/1994 | Farnworth et al. | 437/209 |
| 5,432,127 | 7/1995 | Lamson et al. | 437/182 |
| 5,432,380 | 7/1995 | Jin et al. | 257/676 |
| 5,455,200 | 10/1995 | Bigler et al. | 437/220 |
| 5,548,160 | 8/1996 | Corbett et al. | 257/666 |

FOREIGN PATENT DOCUMENTS

| | | |
|---|---|---|
| 58-31514 | 2/1983 | Japan . |
| 60-35527 | 2/1985 | Japan . |
| 61-56419 | 3/1986 | Japan . |
| 2 278 497 | 11/1994 | United Kingdom . |
| 2 288 909 | 11/1995 | United Kingdom . |

*Primary Examiner*—David A. Simmons
*Assistant Examiner*—Linda L. Gray
*Attorney, Agent, or Firm*—Stephen A. Gratton

[57] ABSTRACT

An apparatus for attaching adhesive tape to a leadframe. The apparatus includes: a support frame; an adhesive tape on a reel mounted to the frame; a stationary cutter base mounted to the frame with an opening therethrough having a peripheral outline where the opening receives a leading terminal end of the tape and a portion of the tape following the leading terminal end, a channel in the base to guide the tape into the opening, and a block to hold the tape in the channel and in the opening; and a cutter which moves through the opening to cut a decal from the tape within the opening and to apply the decal to a leadframe. The cutter and the decal having an outline substantially matching the peripheral outline of the opening such that wasted tape is eliminated.

11 Claims, 5 Drawing Sheets

APPARATUS FOR ATTACHING ADHESIVE TAPE TO LEAD-ON-CHIP LEADFRAMES

CROSS REFERENCE TO RELATED APPLICATIONS

This application is a division of application Ser. No. 08/509,048 filed Jul. 31, 1995.

FIELD OF THE INVENTION

This invention relates generally to semiconductor packaging and particularly to a method and apparatus for cutting and applying adhesive tape to a leadframe for a lead-on-chip semiconductor package.

BACKGROUND OF THE INVENTION

One type of semiconductor package is known as a lead-on-chip (LOC) package. A lead-on-chip package includes a semiconductor die encapsulated in a polymeric material (e.g., epoxy resin). This package is formed using a metal leadframe. The leadframe supports several dice for packaging and provides the leads for the completed package. A conventional leadframe includes a mounting paddle for each die and lead fingers that are wire bonded to bond pads on the die and then trimmed and formed into leads. However, with a lead-on-chip package, the lead fingers of the leadframe, not only form the leads in the completed package, but also support the die during the encapsulation process.

Prior to the encapsulation process, the die is attached to an underside of the lead fingers. The LOC package provides superior heat transfer from the die and shortens the length of the bond wires. In addition, the LOC package can be formed with a more reliable seal. U.S. Pat. No. 4,862,245 to Pashby et al. and U.S. Pat. No. 4,916,519 to Ward describe lead-on-chip semiconductor packages.

A common method of attaching and wire bonding a LOC die to a LOC leadframe is known as area wire bonding, or A-wire bonding. A conventional A-wire bonding process begins by attaching the die to the lead fingers of the leadframe. For attaching the die to the leadframe, a double-sided adhesive tape can be used. The tape includes a thermoset adhesive on both sides such as an epoxy, acrylic, silicone or polyimide. This type of tape is sometimes referred to as LOC tape and can also function as an alpha barrier for the die. The LOC tape is initially attached to the leadframe using heat and pressure. Then the face of the die is attached to the LOC tape using heat and pressure and an oven is used to cure the adhesive. After the curing step, the leadframe is transferred to a wirebonder machine where bond wires are attached to the bond pads of the die and to the lead fingers of the leadframe.

Prior to the die attach, the LOC tape must be placed onto the heated leadframe in a configuration that secures the die to the lead fingers but allows access to the bond pads of the die for wirebonding. Typically, a single piece of LOC tape is dispensed from a continuous roll of tape and then punched into two decals that are spaced apart and cut away to provide access to the bond pads.

One problem with this process is that LOC tape is an expensive material and a large amount of tape is wasted during formation of the LOC decals. With a conventional LOC punching apparatus the width of the tape must be large enough to punch two decals with a space in-between the decals. Typically, the decals are punched from the center of a continuous length of tape having a width that is much larger than the peripheral dimensions of the decal. In addition, there is wasted tape across the length of the tape in an area between the decals for adjacent dice. In some systems approximately 50 to 75% of the tape is wasted. It would be advantageous to be able to form a LOC decal without wasting tape.

In view of the foregoing, it is an object of the present invention to provide an improved method and apparatus for cutting LOC tape into decals and for applying the cut decals to a leadframe with no wasted tape.

It is yet another object of the present invention to provide an improved apparatus for cutting LOC tape and for applying the cut decals to a leadframe at production speeds and with no wasted tape.

Other objects, advantages and capabilities of the present invention will become more apparent as the description proceeds.

SUMMARY OF THE INVENTION

In accordance with the present invention, an improved method and apparatus for cutting and applying LOC tape to a leadframe with no wasted tape are provided. The decals can then be used for securing a semiconductor die to the leadframe. The method uses one or more continuous ribbons of double sided adhesive tape that are cut into decals and applied in a desired pattern to the leadframe. A finished dimension (e.g., width) of each decal is the same as a width of the tape. Another finished dimension (e.g., length) of each decal is controlled by cutting an indexed length of the tape. Using this method there are only two cut edges per decal and only one cut is required for each index of the tape and leadframe.

The decals are cut and applied in a desired pattern to select portions of the leadframe, such as to the lead fingers or bus bars of the leadframe. The decals are cut and pressed against the leadframe in a continuous process in which the tape is indexed to a particular length and the leadframe is indexed for application of the cut decals.

An apparatus for performing the method of the invention includes: a support frame for rotatably mounting one or more reels of double sided adhesive tape of a desired width; a tape guide for guiding continuous ribbons of tape from the reels into guide openings for cutting; a pair of feed rollers for continuously feeding and indexing the ribbons of tape into the guide openings; and a cutter assembly adapted to cut decals from the ribbons of tape held in the guide openings and to apply the cut decals in a desired pattern to a die mounting area of the leadframe. The leadframe is heated and held against the guide openings of the cutter assembly by a leadframe handling apparatus. The leadframe handling apparatus also indexes the leadframe to align die mounting areas on the leadframe to the cutter assembly.

DETAILED DESCRIPTION OF THE PREFERRED EMBODIMENT

Figure 1:
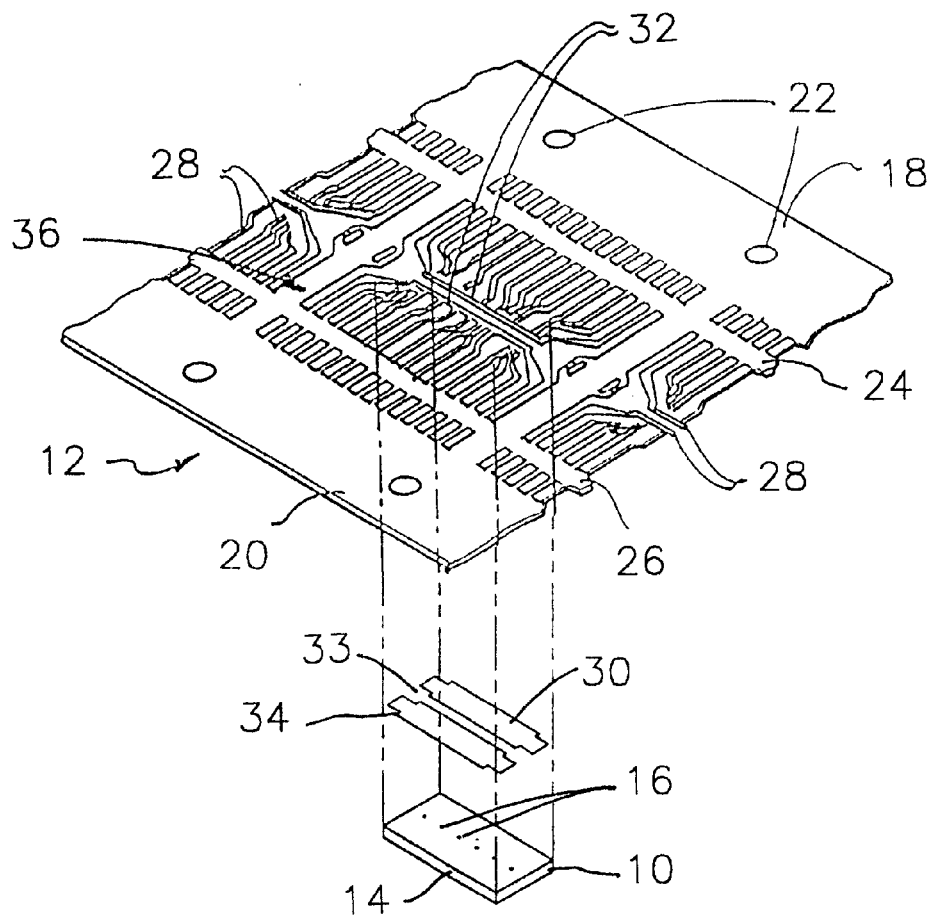
FIG. 1 is a perspective view of a prior art LOC leadframe and LOC semiconductor die.
Figure 2:
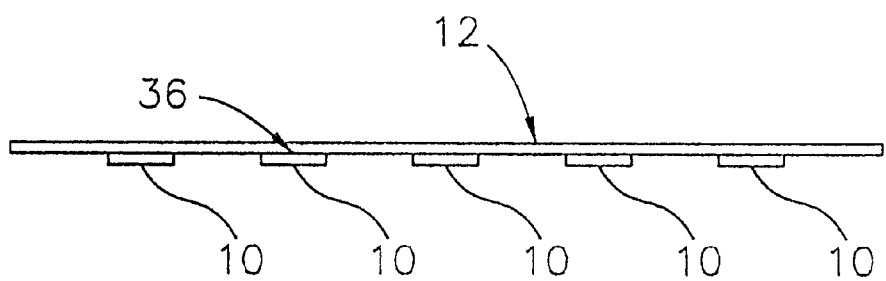
FIG. 2 is a side elevation view of a prior art LOC leadframe with several semiconductor dice attached thereto.

Referring now to FIGS. 1 and 2, a prior art lead-on-chip (LOC) die 10 and lead-on-chip (LOC) leadframe 12 are shown. The LOC die 10 is thin, flat and generally rectangular in shape and includes a die face 14, or active side, wherein the integrated circuitry is formed. A plurality of bond pads 16 are formed across the center and edge portions of the die 10 in electrical contact with the integrated circuits formed on the die 10.

The leadframe 12 is formed from metal sheet and includes side rails 18, 20 formed with indexing holes 22. The indexing holes 22 facilitate transport and handling of the leadframe 12 by automated packaging machinery. The leadframe 12 also includes sidebars 24, 26 (or dam bars) for increased rigidity. The siderails 18, 20 and sidebars 24, 26 are trimmed away during a trim and form operation. In addition, the leadframe 12 includes a plurality of generally parallel and spaced lead fingers 28. During the LOC packaging process the lead fingers 28 are bonded to thin bond wires which are also bonded to the bond pads 16 on the die 10. The lead fingers 28 will ultimately be trimmed and formed into leads which function to electrically connect the die 10 to the outside world. However, during the packaging process the lead fingers 28 function to support the die and facilitate heat transfer from the die 10 during the packaging process. The leadframe 12 can also include bus bars 32 for making multiple connections to the bond pads 16. The leadframe 12 is formed such that the lead fingers 28 and bus bars 32 form a separate die mounting area 36 for each die 10.

As shown in FIG. 2, multiple dice 10 are attached to the leadframe 12. Each die 10 is mounted in a die mounting area 36 of the leadframe 12. As shown in FIG. 1, the dice 10 are attached to the lead fingers 28 using punched decals 30. The punched decals 30 are punched from a continuous roll of LOC tape (not shown). The decals 30 are punched with a space 33 therebetween to allow access for the bond pads 16 across the center of the die 10. In addition, a corner portion 34 of the decals 30 is punched away to allow access for the bond pads 16 along the sides of the die 10. As previously explained punching decals 30 in this manner wastes a large amount of LOC tape.

Figure 3:
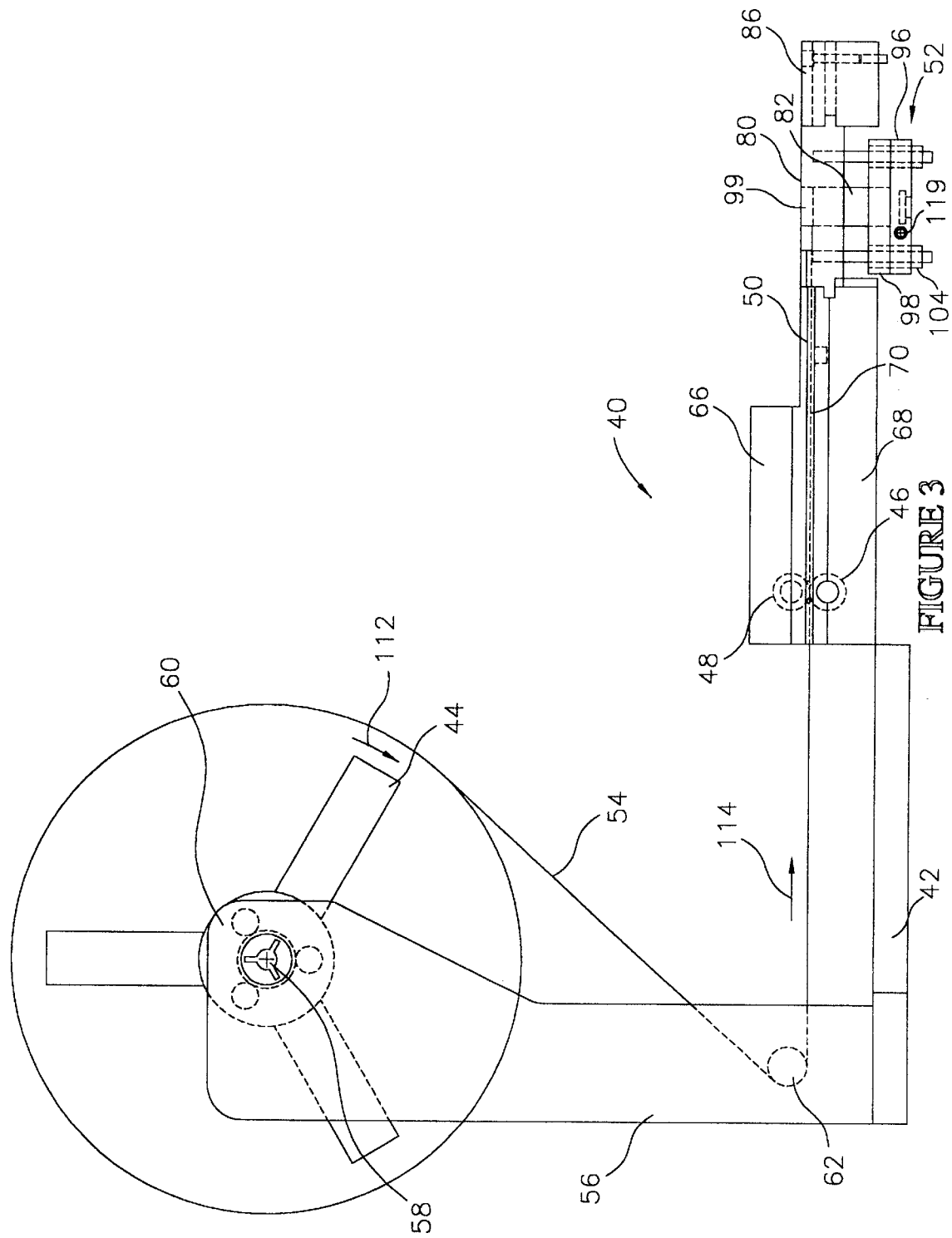
FIG. 3 is a side elevation view of an apparatus constructed in accordance with the invention for cutting and applying LOC decals to a LOC leadframe.
Figure 4:
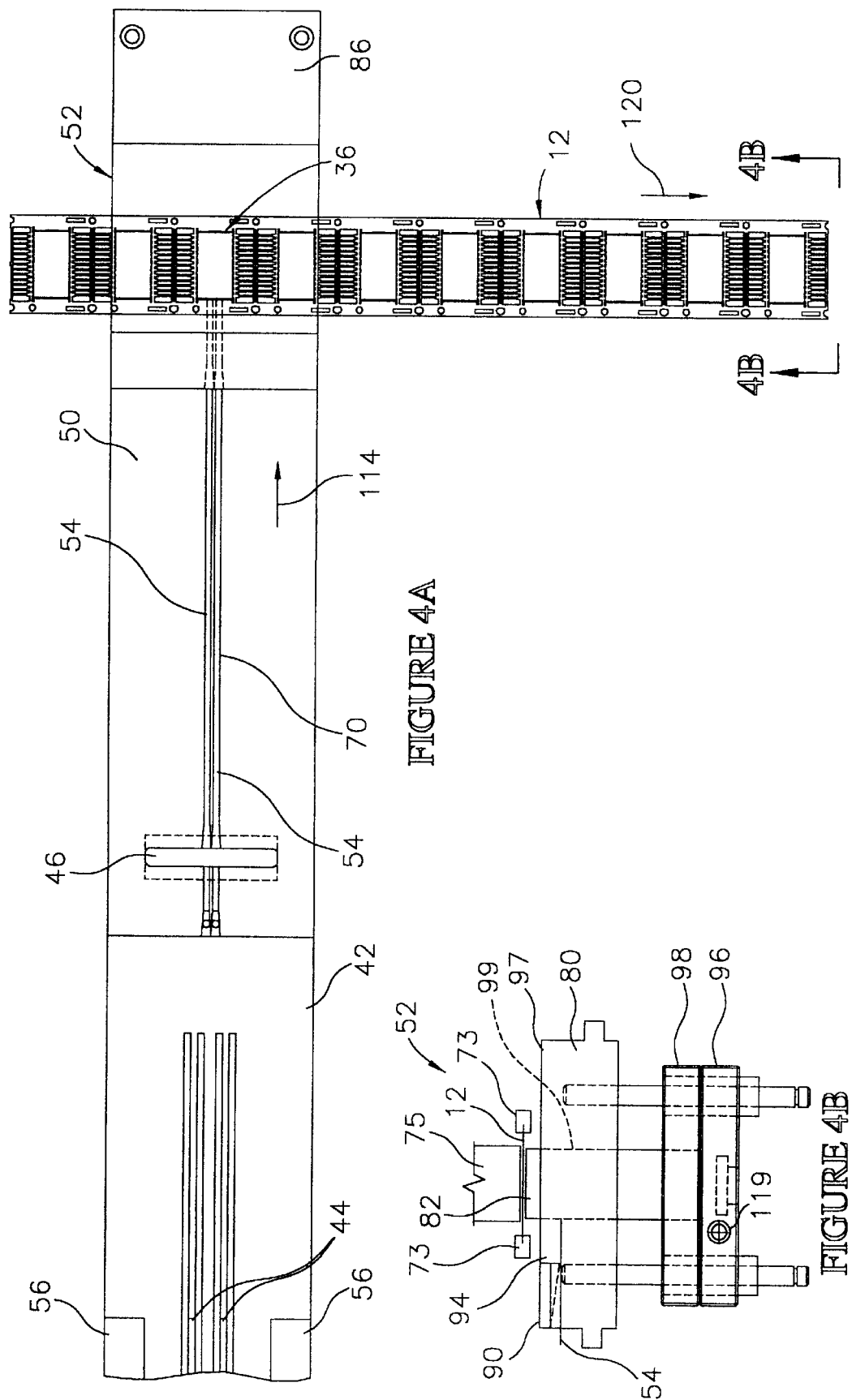
FIG. 4A is a plan view of a portion of the apparatus shown in FIG. 3, with components removed, and showing a LOC leadframe having decals being applied thereto in accordance with the invention.
FIG. 4B is an end view taken along section line 4A—4A of FIG. 4A.
Figure 5:
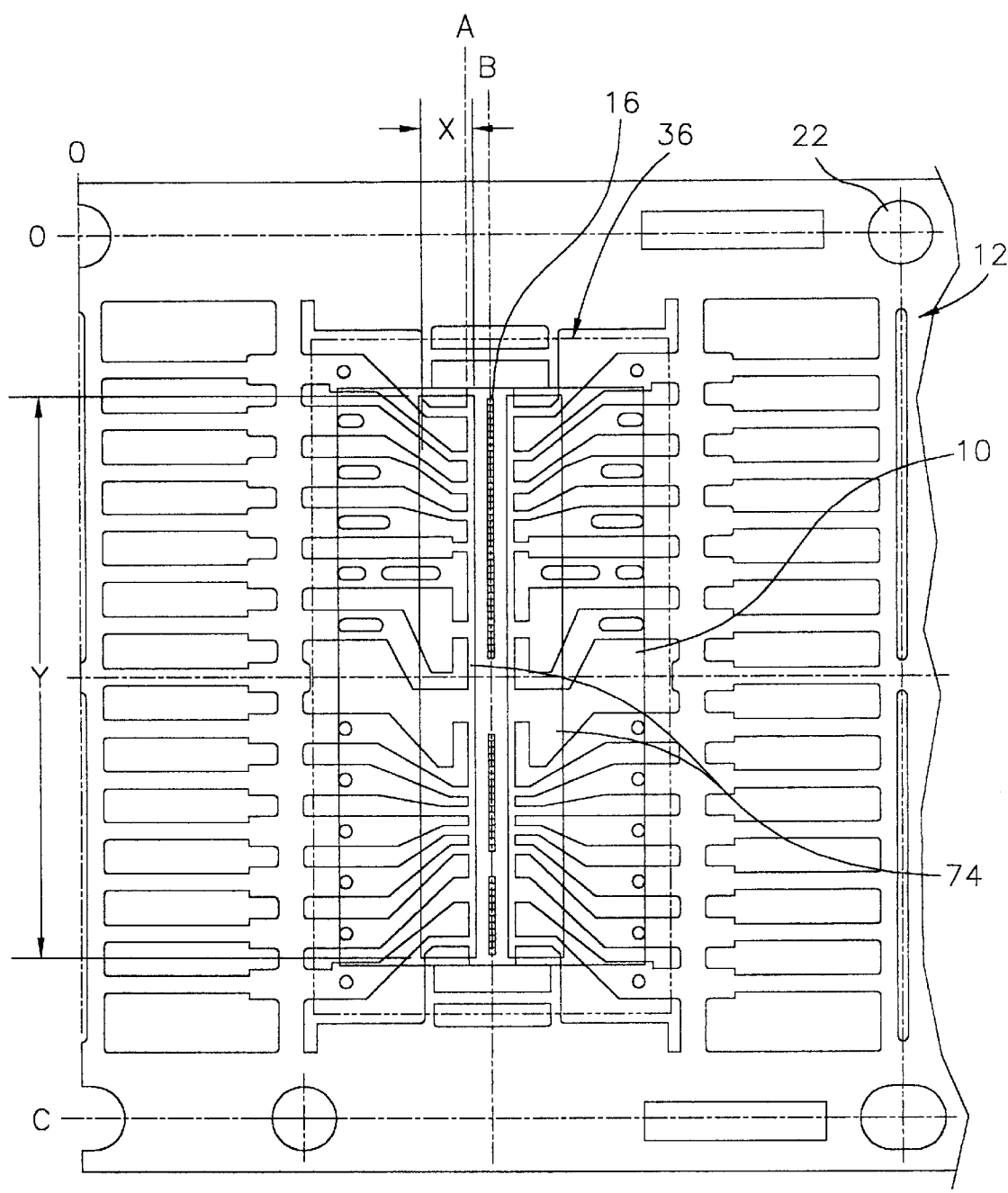
FIG. 5 is a schematic bottom view of a LOC leadframe superimposed with a semiconductor die and LOC decals cut in accordance with the invention.

Referring now to FIGS. 3, 4A, and 4B, a tape cutting apparatus 40 constructed in accordance with the invention is shown. The tape cutting apparatus 40 includes: a support frame 42; a plurality of tape reels 44 freely rotatably mounted to the support frame 42 and adapted to supply continuous lengths of double side adhesive tape 54 for cutting; a pair of tape feed rollers 46, 48 for feeding and indexing the tape 54 for cutting; a tape guide 50 for guiding the tape 54 for cutting; and a tape cutter assembly 52 for cutting the tape 54 into decals 74 (FIG. 5).

In the illustrative embodiment there are two tape reels 44 for supplying two continuous lengths of tape 54 and two cut decals 74 per die 10. However, depending on the application and the number of decals required for each die 10, the method of the invention can be practiced using a greater or lesser number of tape reels 44.

The support frame 42 includes vertical supports 56 adapted to support the tape reels 44 for rotation. The vertical supports 56 include idler rollers 62 for supporting the tape 54. Each tape reel 44 includes a mounting shaft 58 and the vertical supports 56 include bearings 60 for supporting the mounting shafts 58 for rotation. The mounting shafts 58 are removably journaled to the bearings 60 to permit removal and replacement of the tape reels 44 as the tape 54 on a reel 44 is used up.

The tape 54 includes a substrate formed of a flexible polymeric material coated on both sides with an adhesive. By way of example and not limitation, one suitable tape 54 is Hitachi HM 122U tape manufactured by Hitachi Chemical Co. LTD. This tape has an overall thickness of about 0.0035" and is coated with about a 0.0008" thick layer of adhesive on both sides. A width of the tape 54 is the same as the finished width of the cut decals 74. Accordingly, the width of the tape 54 is selected to form decals 74 with a finished width to cover a select portion of the lead frame 12. In the illustrative embodiment the decals 74 cover just the tip portion (i.e., terminal end) of the lead fingers 28 of the leadframe 12 in a particular die mounting area 36. Alternately the width of the tape 54 and placement of the decals 74 can be selected to cover other desired portions of the leadframe 12.

The tape feed rollers 46, 48 are rotatably mounted on an upper roller mount 66 and a lower roller mount 68 respectively. The tape feed rollers 46, 48 are drivably connected to stepper motors (not shown) adapted to drive the tape feed rollers 46, 48 through predetermined complete or partial revolutions. Each revolution or partial revolution of the tape feed rollers 46, 48 moves the tape 54 a corresponding linear amount. The upper tape feed roller 48 is spring loaded in the vertical direction to permit tensioning of the tape 54 as required. In this manner the tape feed rollers 46, 48 can feed or index a predetermined length of tape 54 through the tape guide 50 and into the tape cutter assembly 52 for cutting.

The tape guide 50 is formed with a guide channel 70 for receiving the tape 54 from each tape reel 44. In addition, the guide channel 70 is adapted to maintain a precise spacing and parallel orientation of the ribbons of tape 54 as they are fed and indexed by the tape feed rollers 46, 48 into the tape cutter assembly 52. In FIG. 4 the upper roller mount 66 and tape feed roller 48 are cut away to show the confinement of the tape 54 within the guide channel 70. The tape 54 is fully enclosed by the guide channel 70 from a point just upstream of the tape feed rollers 46, 48 to the tape cutter assembly 52. As will be further explained, the tape cutter assembly 52 is also configured to enclose and guide the tape 54 for cutting.

At the same time that the ribbons of tape 54 are fed into the tape cutter assembly 52, the leadframe 12 is also fed and indexed into tape cutter assembly 52. The relative position of the leadframe 12 with respect to the ribbons of tape 54 is clearly shown in FIG. 4A. In general, an orientation and direction of movement 120 of the leadframe 12 is generally perpendicular to the orientation and direction of movement 114 of the ribbons of tape 54. The leadframe 12 is indexed into the tape cutter assembly 52 such that one die mounting area 36 (FIG. 5) at a time is positioned for the simultaneous application of the cut decals 74 (FIG. 5).

The leadframe 12 is fed and indexed into the tape cutter assembly 52 using a leadframe handling apparatus 72 (FIG. 4B). One suitable leadframe handling apparatus 72 is manufactured by ESC Manufacturing Company, Warrington, Pa. and is designated an ESC Apollo 9200 LOC die attach system. As shown in FIG. 4B, the leadframe handling apparatus 72 includes guide members 73 for guiding the leadframe 12. The leadframe handling apparatus 72 also includes an indexer walk beam (not shown) for indexing the leadframe 12 to a location for applying the cut decals 74. As also shown in FIG. 4B, the leadframe handling apparatus 72 includes a heat block 75 to provide the heat necessary to activate the adhesive on the tape 54 and to hold the leadframe 12 down as the decals 74 are applied by the tape cutter assembly 52.

The tape cutter assembly 52 is adapted to cut the decals 74 (FIG. 5) from the ribbon of tape 54 and to press the cut decals 74 against the heated leadframe 12. In a subsequent step (not shown) the die 10 will be pressed against the decals 74 for securing the die 10 to the leadframe 12. FIG. 5 shows the relative locations of the decals 74 after being cut and pressed by the tape cutter assembly 52 to the leadframe 12. In FIG. 5, the dotted rectangle represents the die mounting area 36. The decals 74 are generally rectangular shaped and are secured to the underside of the leadframe 12 in the die mounting area 36. In the illustrative embodiment a pair of decals 74 are applied to the leadframe 12. Alternately a greater or lesser number of decals 74 can be applied to the leadframe 12. Furthermore, the decals 74 can be applied to other portions of the leadframe 12 such as to bus bars or to connecting portions of the leadframe formed and placed specifically for attaching the die 10 to the leadframe 12.

In FIG. 5, the "X" dimension represents the finished width of a rectangular shaped decal 74. The "Y" dimension represents the finished length of the rectangular shaped decal 74. By way of example and not limitation, Table 1 provides exemplary dimensions for the decals 74, die 10 and spacing from reference points (0) on the leadframe 12.

TABLE 1

Dimensions in Inches

| Die Size | "X" (TAPE) | "Y" (TAPE) | "A" | "B" | "C" |
| --- | --- | --- | --- | --- | --- |
| 0.262 × 0.569 | 0.047 | 0.551 | 0.340 | 0.360 | 0.870 |
| 0.445 × 0.723 | 0.120 | 0.693 | 0.430 | 0.450 | 1.370 |

As also clearly shown in FIG. 5, the cut decals 74 are located generally parallel to one another and spaced apart by a distance sufficient to provide access to the bond pads 16 on the die 10. As indicated by the above table, the spacing between the cut decals can be on the order of about 0.030" but can be more or less as required. In addition, as clearly shown in FIG. 5, the cut decals 74 have a finished width "X" that is wide enough to cover just the tip portions of the lead fingers 28 of the leadframe 12. The finished width of the cut decals 74 is determined solely by the width of the tape 54. The finished length "Y" of the cut decals 74 is determined by the indexing and cutting steps. Thus only one cut edge per decal is formed for each index of the tape 54 and leadframe 12. Alternately this system can be rotated 90° such that a finished length of the decals 74 is determined by a width of the tape 54 and a finished width of the decals 74 is determined by the cutting step.

Figure 6:
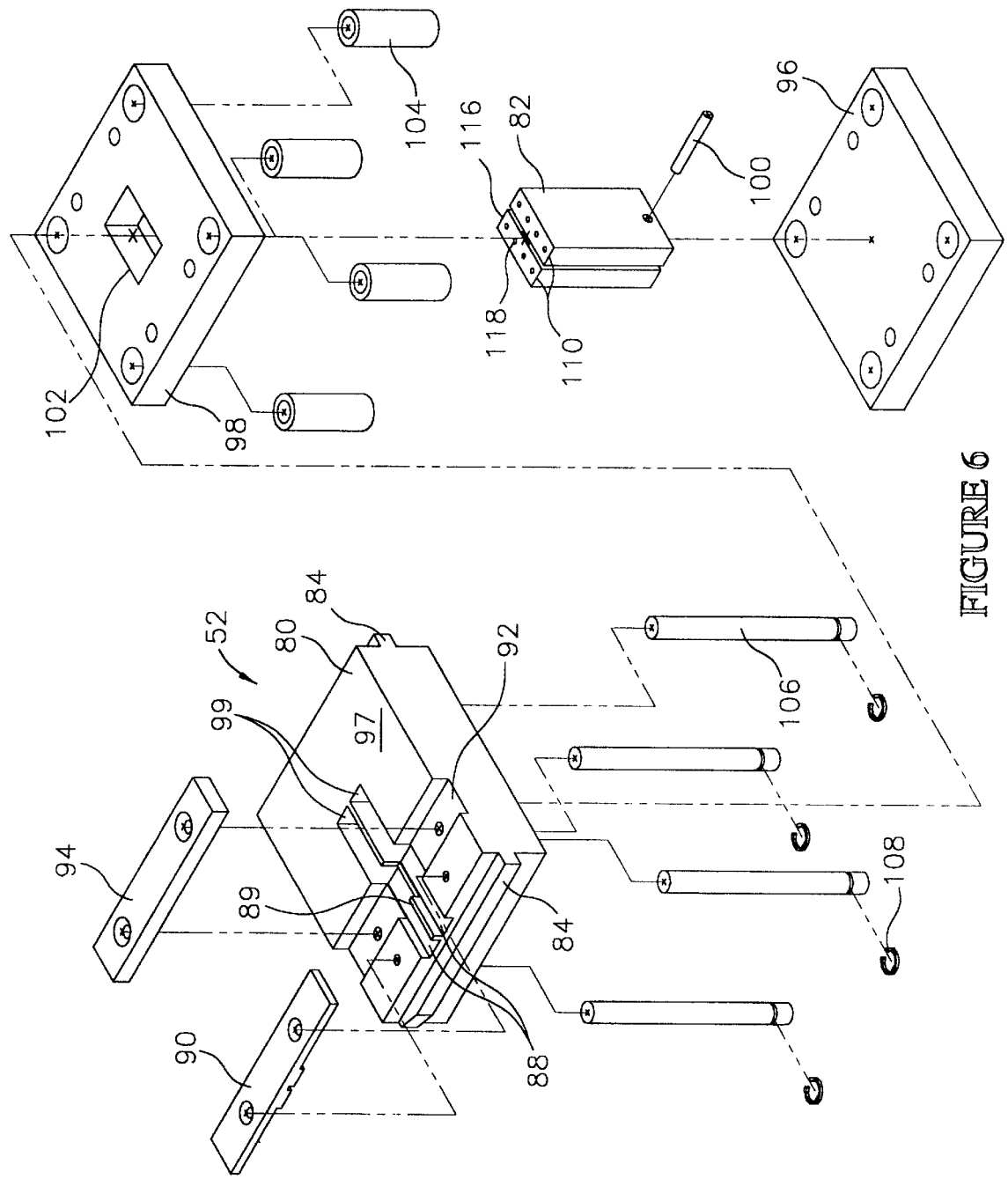
FIG. 6 is an exploded view of a portion of apparatus shown in FIG. 3 illustrating a tape cutter assembly of the apparatus.

Referring now to FIG. 6, components of the tape cutter assembly 52 are shown in an exploded view. The tape cutter assembly 52 includes a cutter base 80; a pair of tape cutters 82 mounted for reciprocal movement with respect to the cutter base 80; and a pair of guide openings 99 for aligning the tape 54 with the tape cutters 82 for cutting.

The cutter base 80 is formed as a solid metal block and includes dovetails 84 on either side for attachment to the tape guide 50 (FIG. 3) and to a mounting block 86 (FIG. 3) of the support frame 42. The cutter base 80 also includes separate entrance channels 88 separated by a partition 89.

The entrance channels 88 are sized for receiving and maintaining separation of the ribbons of tape 54. A tape lead-in member 90 attaches to the cutter base 80 to cover the entrance channels 88 and form spaced rectangular passages separated by the partition 89.

A rectangular groove 92 is formed in the cutter base 80 wherein a cutter block 94 is mounted. The tape 54 is guided by the entrance channels 88 under the lead-in member 90 and under the cutter block 94. As clearly shown in FIG. 4B, the lead-in member 90 is tapered to guide the tape 54 under the cutter block 94. The cutter block 94 is adapted to hold the uncut ribbons of tape 54 down as the decals are simultaneously cut and pressed against the leadframe 12.

The guide openings 99 for the cut decals 74 extend through the full thickness of the cutter base 80. The guide openings 99 are adapted to align the tape 54 with the tape cutters 82 and to align the cut decals 74 with the leadframe 12. As clearly shown in FIG. 4B, the tape cutters 82 are adapted to move through the guide openings 99 to cut the tape 54 held down by the cutter block 94. Furthermore, the tape cutters 82 are adapted for movement past an upper surface 97 of the cutter base 80 to press the cut decals 74 against the leadframe 12 held against the heat block 75 of the leadframe handling apparatus 72. The tape cutters 82 include vacuum passages 118 (FIG. 6) in flow communication with a vacuum conduit 119 (FIG. 4B). The vacuum passages 118 apply a vacuum force to the decals 74 for securing the cut decals 74 to the tape cutters 82 as the cutters 82 are extended to press the decals 74 against the leadframe 12. The vacuum conduit 119 (FIG. 4B) is in flow communication with a vacuum source (not shown) and suitable control valves (not shown) for effecting cycling of the vacuum to the vacuum passages 118 as required.

A peripheral outline of the decals 74 matches the peripheral outline of the end surfaces 116 of the tape cutters 82 and also the peripheral outline of the guide openings 99. In the illustrative embodiment the decals 74 have a generally rectangular peripheral shape. However, other peripheral shapes such as a square are also possible. Depending on the dimensions of the leadframe 12 and die 10, the tape cutters 82 and guide openings 99 can be dimensioned as required.

As shown in FIG. 6, the tape cutters 82 are attached to a mounting plate 96 and to a mounting shoe 98. A dowel pin 100 secures the tape cutters 82 to one another and to the mounting plate 96. The mounting shoe 98 includes a rectangular opening 102 for the tape cutters 82. Sleeve bearings 104 are attached to the mounting shoe 98 and mounting plate 96 and slide over guide posts 106 attached to the cutter base 80. Retaining rings 108 are attached to the guide posts 106 to prevent the sleeve bearings 104 from sliding off the guide posts 106. The assembled tape cutter assembly 52 is clearly shown in FIGS. 3 and 4B.

The tape cutters 82 are formed with sharp, burr-free cutting edges 110 for cutting the ribbons of tape 54. In addition, the tape cutters 82 include a finished surface (e.g., 8 micro inches). The guide openings 99 in the mounting shoe 98 are also formed with finished surfaces. The location of the tape cutters 82 with respect to the cutter block 94 is controlled by the guide openings 99 in the cutter base 80. Therefore the clearance between the tape cutters 82 and the guide openings 99 must be as small as possible but still maintain free sliding movement of the tape cutters 82 through the guide openings 99.

The mounting plate 96, mounting shoe 98 and tape cutters 82 are adapted to be driven up and down on the guide posts 106 by a hydraulic cylinder or other actuator (not shown).

By way of example and not limitation, a reciprocating speed for the tape cutters 82 is on the order of 40 strokes per minute.

OPERATION

As shown in FIG. 3, during the operation of the tape cutting apparatus 40, the tape feed rollers 46, 48 unwind the tape reels 44 in the directions indicated by rotational arrow 112. The ribbons of tape 54 move in a linear direction 114. The ribbons of tape 54 are driven by the tape feed rolls 46, 48 through the tape guide 50 and into the entrance channels 88 (FIG. 6) in the tape cutter assembly 52.

Indexing of the ribbons of tape 54 by the tape feed rolls 46, 48 is such that the tape 54 fills the guide openings 99 (FIG. 6) in the cutter base 80. The amount the tape 54 is indexed and size of the guide openings 99 are selected to provide a desired finished length for the cut decals 74. With a die mounting area 36 of the leadframe 12 positioned over the guide openings 99, the tape cutters 82 are actuated to cut the tape 54 to form the decals 74. At the same time that the edge 110 (FIG. 6) of the tape cutters 82 cuts the decals 74, the end surfaces 116 (FIG. 6) of the tape cutters 82 press the decals 74 against the heated leadframe 12. The vacuum passages 118 function to attach the decals 74 to the surface 116 of the cutters 82 as the decals 74 are pressed against the leadframe 12.

Once the decals 74 are cut and pressed against the leadframe 12, the tape cutters 82 are retracted. The lead frame 12 is then indexed to position another die mounting area 36 of the leadframe 12 over the guide openings 99 in the cutter base 80. The above sequence is then repeated for forming and pressing decals 74 against the adjacent die mounting area.

Thus the invention provides an improved method and apparatus for cutting and applying double side adhesive tape to a leadframe. While the invention has been described with reference to certain preferred embodiments, as will be apparent to those skilled in the art, certain changes and modifications can be made without departing from the scope of the invention as defined by the following claims.

What is claimed is:

1. An apparatus for attaching adhesive tape to a leadframe comprising:

a support frame;

an adhesive tape at least partially contained on a reel rotatably mounted to the support frame;

a pair of feed rollers attached to the support frame and configured to index the tape;

a stationary cutter base mounted to the support frame comprising an opening therethrough having a peripheral outline and configured to receive a leading terminal end of the tape and a portion of the tape following the leading terminal end, a channel therein configured to guide the tape into the opening, and a block proximate the channel configured to hold the tape in the channel and in the opening; and a cutter configured to move through the opening to cut a decal from the tape within the opening and to apply the decal to the leadframe, the cutter and the decal having an outline substantially matching the peripheral outline of the opening.

2. The apparatus of claim 1 further comprising a lead in member on the channel configured to guide the tape through the channel into the opening.

3. The apparatus of claim 1 further comprising a second channel in the base, a second opening through the base having the peripheral outline, and a second cutter configured to move through the second opening to cut a second decal from a second portion of a second tape held within the second opening where the second decal has a second decal outline substantially matching the peripheral outline and to apply the second decal to the leadframe.

4. The apparatus of claim 1 further comprising a leadframe handling apparatus for positioning the leadframe proximate to the opening.

5. An apparatus for attaching adhesive tape to a leadframe comprising:

a support frame;

a first adhesive tape at least partially contained on a first reel and and a second adhesive tape at least partially contained or a second reel, the first reel and the second reel rotatably mounted to the support frame;

a cutter assembly on the support frame, the cutter assembly comprising:

a stationary cutter base;

a first opening through the base having a first peripheral outline and configured to receive a first leading terminal end of the first tape and a portion of the first tape following the first leading terminal end for cutting;

a second opening through the base having a second peripheral outline and configured to receive a second leading terminal end of the second tape and a portion of the second tape following the second leading terminal end for cutting;

a first cutter configured to move through the first opening to cut a first decal from the first tape within the first opening and to apply the first decal to the leadframe, the first cutter and first decal having a first outline substantially matching the first peripheral outline;

a second cutter configured to move through the second opening to cut a second decal from the second tape within the second opening and to apply the second decal to the leadframe, the second cutter and the second decal having a second outline substantially matching the second peripheral outline.

6. The apparatus of claim 5, wherein the first peripheral outline and the second peripheral outline are generally rectangular shaped.

7. An apparatus for attaching adhesive tape to a leadframe comprising:

a support frame comprising a first guide channel;

a feed mechanism on the support frame configured to move an adhesive tape through the first guide channel;

a stationary cutter base mounted to the support frame comprising a second guide channel in the base, a block on the second guide channel, and an opening through the base having a peripheral outline, the second guide channel and the block configured to enclose and guide a leading terminal end of the tape and a portion of the tape following the leading terminal end into the opening and to hold the tape during cutting of the within the opening; and a cutter configured to move through the opening to cut a decal from the tape within the opening and to apply the decal to the leadframe, the cutter and the decal having an outline substantially matching the peripheral outline of the opening such that the decal can be aligned with the leadframe and with the cutter by the opening.

8. The apparatus of claim 7 further comprising a third guide channel in the base, a second block proximate the third guide channel, a second opening through the base, and a second cutter configured to move through the second opening to cut a second decal from a second portion of a second tape held within the second opening where the second decal has a second decal outline substantially matching the peripheral outline and to apply the second decal to the leadframe.

9. The apparatus of claim 7 wherein the cutter comprises a vacuum passage for attaching the decal to the cutter.

10. An apparatus for attaching adhesive tape to a leadframe comprising:

a support frame;

a feed mechanism on the support frame configured to move a first adhesive tape and a second adhesive tape along the support frame;

a stationary cutter base mounted to the support frame comprising spaced first and second guide channels in the base, a block on the channels, and a pair of spaced first and second openings through the base where the first opening has a first peripheral outline and the second opening has a second peripheral outline, the channels and the block configured to (a) enclose and guide a first leading terminal end of the first tape and a portion of the first tape following the first leading terminal end into the first opening, (b) enclose and guide a second leading terminal end of the second tape and a portion of the second tape following the second leading terminal end into the second opening, (c) hold the first tape during cutting of the first tape within the first openings, and (d) hold the second tape during cutting of the second tape within the second opening;

a first cutter configured to move through the first opening to cut a first decal from the first tape within the first opening and to apply the first decal to the leadframe, the first cutter and the first decal having an outline substantially matching the first peripheral outline such that the first decal can be aligned with the leadframe and with the first cutter by the first opening; and a second cutter configured to move through the second opening to cut a second decal from the second tape within the second opening and to apply the second decal to the leadframe, the second cutter and the second decal having an outline substantially matching the second peripheral outline such that the second decal can be aligned with the leadframe and with the second cutter by the second opening.

11. The apparatus of claim 10 wherein the first cutter and the second cutter each comprise a vacuum passage.

* * * * *

UNITED STATES PATENT AND TRADEMARK OFFICE
CERTIFICATE OF CORRECTION

PATENT NO.   : 6,012,502
DATED        : Jan. 11, 2000
INVENTOR(S)  : John VanNortwick
               Scott Clifford It is certified that error appears in the above-identified patent and that said Letters Patent is hereby corrected as shown below:

In claim 7 @ column 8, line 58, after "the" second occurence, add --tape--.

Signed and Sealed this

First Day of August, 2000

Attest:

Q. TODD DICKINSON

Attesting Officer

Director of Patents and Trademarks